United States Patent [19]

Yamagishi et al.

[11] Patent Number: 4,574,298

[45] Date of Patent: Mar. 4, 1986

[54] III-V COMPOUND SEMICONDUCTOR DEVICE

[75] Inventors: Haruo Yamagishi, Fujisawa; Hisao Kamo, Yokohama, both of Japan

[73] Assignee: Tokyo Shibaura Denki Kabushiki Kaisha, Japan

[21] Appl. No.: 565,101

[22] Filed: Dec. 23, 1983

[30] Foreign Application Priority Data

Dec. 27, 1982 [JP] Japan ................. 57-227057

[51] Int. Cl.$^4$ ...................... H01L 29/46; H01L 29/64
[52] U.S. Cl. .......................................... 357/71; 357/15; 357/22
[58] Field of Search ............................ 357/15, 22, 71

[56] References Cited

FOREIGN PATENT DOCUMENTS

| 3200788 | 7/1982 | Fed. Rep. of Germany | 357/71 |
| 2402304 | 4/1979 | France | 357/71 |
| 57-211269 | 12/1982 | Japan | 357/71 |
| 58-77257 | 5/1983 | Japan | 357/71 |
| 2104290 | 3/1983 | United Kingdom | 357/71 |

*Primary Examiner*—Martin H. Edlow
*Assistant Examiner*—Jerome Jackson
*Attorney, Agent, or Firm*—Finnegan, Henderson, Farabow, Garrett & Dunner

[57] ABSTRACT

A semiconductor device with one or two conductive layers comprising a nitride of a high-melting transition metal of one of Groups IV, V and VI of the Periodic Table deposited between a III-V compound, such as GaAs, semiconductor substrate and an electrode metal layer.

9 Claims, 12 Drawing Figures

III-V COMPOUND SEMICONDUCTOR DEVICE

BACKGROUND OF THE INVENTION (a) Field of the Invention

The present invention relates to a III-V compound semiconductor device having a conductive layer consisting of a nitride of a high-melting transition metal.

(b) Description of the Prior Art

ICs using a III-V compound semiconductor, especially GaAs, have recently undergone considerable development. The ion implantation technique is indispensable in the manufacturing process of these ICs. In association with the ion implantation technique, requirements for materials for an electrode wiring metal layer, an insulating film and so on become strict in a different sense as compared with those for Si ICs.

For example, in order to manufacture a GaAs semiconductor device, Si ions are selectively ion-implanted in a desired portion of the surface of a GaAs substrate at a predetermined dose, and the resultant structure must be annealed at a temperature of 800° to 850° C. for 15 to 20 minutes so as to activate the doped ions. In this selective ion implantation, an $SiO_2$ pattern, an $Si_3N_4$ pattern or a photoresist pattern is used as a mask. However, occasionally, a metal layer is deliberately used as a mask, and the metal layer is left after ion implantation to serve as an electrode.

The self alignment technique in the manufacture of a GaAs MOSFET IC which has recently received a great deal of attention is a typical example. This technique is the most promising technique since an insulating film, which provides good characteristics at an interface between the insulating material and the semiconductor in the Si semiconductor device, is not currently available.

A high-melting transition metal such as W, TiW (10% of Ti) and Ta can be used as a metal mask material which can be used with the self alignment technique. In particular, TiW is preferred because of its good resistance to high temperatures. However, in general, when a high-melting transition metal or its alloy is heated at a temperature of 700° C. or higher, it quickly reacts with the GaAs of the GaAs substrate to change electrical characteristics such as a change in the height $\phi n$ of a Schottky barrier and an increase in an n value as an index value of a rectification property of the barrier. As a result, the required characteristics cannot be obtained.

In order to eliminate these drawbacks, TiW and Mo silicides have received a great deal of attention. It is known that a silicide is an intermetallic compound of a metal and silicon. In general, a high-melting transition metal silicide has a very low resistivity of not more than about $10^{-4}$ $\Omega \cdot cm$, a melting point of not higher than about 2,000° C., and a strong bonding force between the atoms. In this manner, the high-melting transition metal silicide is known as a thermally stable material and has been used as a material for various electrode and wiring layers.

A silicide is sputtered onto the GaAs semiconductor substrate. A target of a desired silicide or a target of a desired metal and Si is used. In the former case, a silicide target having the desired composition must be prepared in advance. In the latter case, it is very difficult to obtain a desired composition.

SUMMARY OF THE INVENTION

The present invention has been made in consideration of the above situation, and has for its object to provide a III-V compound semiconductor device having a structure which is compatible with the self alignment technique and which is capable of maintaining a good electrode surface even after high-temperature annealing.

According to an aspect of the present invention, there is provided a semiconductor device characterized in that a first conductive layer including a nitride of a high-melting transition metal of one of Groups IV, V and VI of the Periodic Table is formed on a III-V compound semiconductor substrate, and an electrode metal layer is formed on the first conductive layer.

According to another aspect of the present invention, there is provided a semiconductor device characterized in that a second conductive layer comprising a nitride of a high-melting transition metal of one of Groups IV, V and VI of the Periodic Table is sandwiched between the first conductive layer and the electrode metal layer.

The electrical and thermal characteristics of the high-melting transition metal nitrides are substantially equal to those of silicides and have a melting point of 3,000° C. Accordingly, it is expected that bonding between the atoms is strong and the high-melting transition metal nitrides tend not to react with the GaAs substrate. Furthermore, a nitride can be readily formed by sputtering a high-melting transition metal in a gas atmosphere of a gas mixture containing $N_2$ and Ar gases.

Nitrides of high-melting transition metals such as W, Ta, Mo, Ti, Nb, V and Zr are preferable.

The first conductive layer, comprising a high-melting transition metal nitride, is preferably formed on the compound semiconductor substrate to a thickness of 1,000 to 2,000 Å. Furthermore, when a second high-melting transition metal nitride layer different from the first high-melting transition metal nitride layer is formed on the first conductive layer, the second conductive layer preferably has a thickness smaller than that of the first conductive layer, for example, a thickness of 500 to 1,000 Å. The second high-melting transition metal nitride layer may comprise a compound containing a different metal from that of the first high-melting transition metal nitride layer, a compound containing such a different metal as a major constituent (more than 50%), and a compound having the same components but in different proportions. However, the second high-melting transition metal nitride layer preferably comprises a layer wherein the entire metal portion or the major constituent comprises a different metal from that of the first high-melting transition metal nitride layer and is selected from the group consisting of the IV, V and VI group elements.

Gold, aluminum or an alloy thereof can be used as the electrode metal layer formed on the first or second high-melting transition metal nitride layer. A gold layer is preferably formed to a thickness of about 2,000 to 8,000 Å.

DETAILED DESCRIPTION OF THE PREFERRED EMBODIMENTS

Preferred embodiments of the present invention will be described with reference to the accompanying drawings. FIGS. 1A to 1F are sectional views of a semifinished product in the steps of manufacturing a semiconductor device according to an embodiment of the present invention.

Figure 1A:
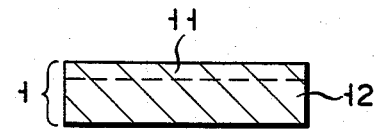
FIGS. 1A to 1F are sectional views for explaining the steps of manufacturing a GaAs semiconductor device according to an embodiment of the present invention.
Figure 1B:
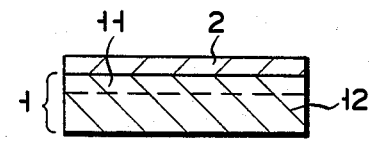

As shown in FIG. 1A, a GaAs epitaxial wafer 1 is prepared which comprises an epitaxial layer 11 having a carrier concentration of $1 \times 10^{16}/cm^3$ and a thickness of 2 μm, and an underlying substrate 12 having a resistivity of $1 \times 10^{-3}$ Ω·cm. As shown in FIG. 1B, a W nitride layer 2 is sputtered onto the surface of the epitaxial layer 11 to a thickness of 2,000 Å. Sputtering is performed as follows. The pretreated epitaxial wafer 1 is properly placed in an RF sputtering apparatus. The pressure in the bell jar of the apparatus is set to be less than $1 \times 10^{-7}$ Torr. Thereafter, an $N_2$ gas is introduced into the bell jar to a pressure of for example $2.0 \times 10^{-5}$ Torr and then an Ar gas is introduced thereinto to a pressure of about $1.8 \times 10^{-4}$ Torr. A W target placed in the bell jar in a gas mixture having a pressure of less than $1.5 \times 10^{-3}$ Torr is sputtered to form a W nitride layer 2 on the surface of the epitaxial layer 11. The ratio of $N_2$ partial pressure to the total pressure in this mixed sputtering gas for forming a nitride film should preferably be 0.05 to 0.3. During sputtering, the epitaxial wafer is heated at a temperature of 150° C.

Figure 1C:
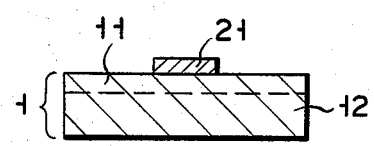

As shown in FIG. 1C, the tungsten nitride layer is then selectively etched by photoengraving to leave a portion corresponding to a circular electrode formation region having a predetermined size (i.e., diameter of 60 μm), thereby forming a W nitride electrode 21. Selective etching of the W nitride layer is performed using a plasma etching method (Chemical Dry Etching).

Figure 1D:
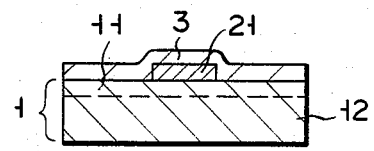
Figure 1E:
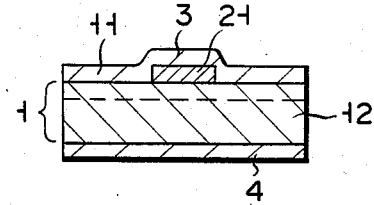
Figure 1F:
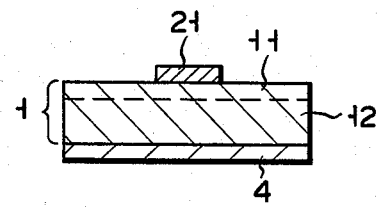

Subsequently, as shown in FIG. 1D, a $CVD$-$SiO_2$ or preferably phospho-silicate glass (PSG) film 3 is deposited at a temperature of for example 300° C. to cover the entire surface including the nitride electrode 21 to a thickness of 3,000 Å. The $CVD$-$SiO_2$ PSG film 3 should preferably contain phosphorus at a concentration of for example $2 \times 10^{20}$ $cm^{-3}$. The resultant wafer 1 is annealed in an Ar or $N_2$ gas at a temperature of 850° C. for 20 minutes. Thereafter, as shown in FIG. 1E, the lower surface of the underlying substrate 12 is polished to a thickness of 150 μm, and an Au-Ge alloy layer is deposited to form an ohmic contact 4. Finally, as shown in FIG. 1F, the $CVD$-$SiO_2$ or PSG film 3 on the surfaces of the epitaxial layer 4 and the W nitride layer 21 is removed.

The static characteristics of the resultant Schottky diode are given as follows: the height $\phi n$ of the barrier is 1.10 eV; the n value is 1.10; a series resistance Rs is 2.0 Ω; and a reverse bias voltage VR is 35 V. For the purpose of comparison, the static characteristics of a Schottky diode obtained such that a barrier metal layer is obtained by depositing a W layer by electron beam deposition on the same substrate as used in the above embodiment were measured: the height $\phi n$ of such a barrier is 0.80 eV; the n value is 1.10; the series resistance Rs is 1.9 Ω; and the reverse bias voltage is 30 V. Thus substantially no difference is found between these two sets of static characteristics.

When electrical coupling with another electrode is required, a metal layer such as an Au or Al layer having a good bonding property can be directly formed on the W nitride electrode 21. More preferably, a transition metal nitride layer, such as a Ta metal nitride layer, is formed on the W nitride electrode 21, and a metal layer such as an Au or Al layer is formed on the transition metal nitride layer.

Figure 2A:
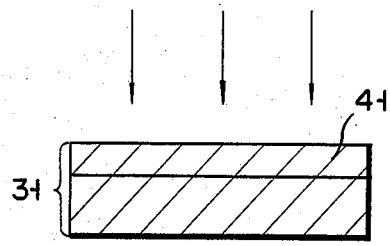
FIGS. 2A to 2F are sectional views for explaining the steps of manufacturing a GaAs semiconductor device according to another embodiment of the present invention.

A case will be described in which the present invention is applied to a self-aligned FET. As shown in FIG. 2A, Si ions are doped in a GaAs semiconductor substrate 31 to form an n-type semiconductor region 41. As shown in FIG. 2B, a W nitride layer 32, a Ta nitride layer 33 and an Au layer 34 are sputtered onto the n-type semiconductor region 41 in the order named, to thicknesses of 1,500 Å, 600 Å and 5,000 Å, respectively.

The W nitride layer 32 and the Ta nitride layer 33 are sputtered in the following manner. The GaAs substrate 31 is properly placed in an RF sputtering apparatus, and the pressure in the bell jar of the apparatus is set at $1 \times 10^{-7}$ Torr. Thereafter, $N_2$ gas is introduced into the bell jar to a pressure of $3.0 \times 10^{-5}$ Torr, and the Ar gas is introduced therein to a pressure of $1.7 \times 10^{-4}$ Torr. W target, Ta target and Au target separately disposed in the bell jar are sputtered to form the W nitride layer 32, the Ta nitride layer 33 and Au layer 34 on the surface of the semiconductor region 41 in the order named. As shown in FIG. 2C, a gate electrode 35 is then formed by photoengraving or chemical dry etching.

Figure 2D:
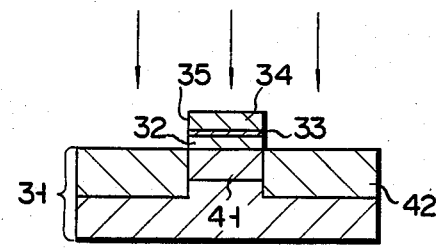
Figure 2B:
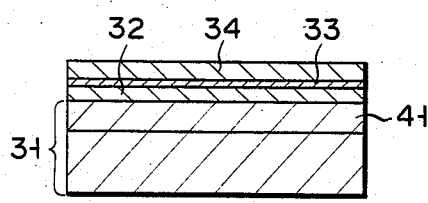
Figure 2E:
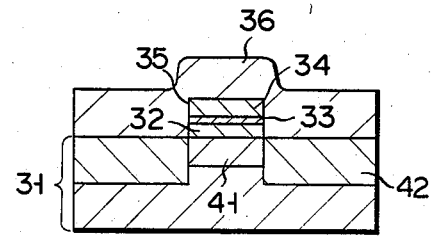
Figure 2C:
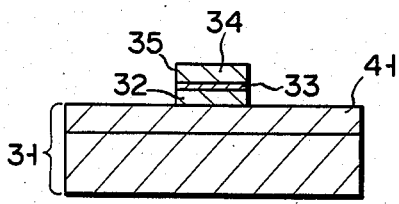

Si ions are ion-implanted in the semiconductor region 41 by using the gate electrode 35 as a mask, thereby forming $n^+$-type layers 42, as shown in FIG. 2D. As shown in FIG. 2E, a $CVD$-$SiO_2$ or preferably PSG film 36 is formed to cover the entire surface including the gate electrode 35 to a thickness of 5,000 Å. The resultant GaAs substrate 31 is annealed in Ar gas at a temperature of 820° C. for 15 minutes so that the doped ions are subjected to activation. Thereafter, the $CVD$-$SiO_2$ film 36 is removed.

Figure 2F:
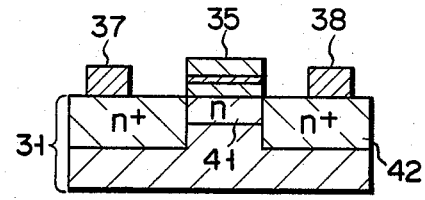

As shown in FIG. 2F, $n^+$-type layers 42 are formed in a self-aligned manner with respect to the gate electrode 35. No abnormality can be found in the gate electrode 35 including the uppermost Au layer 34. A source electrode 37 and a drain electrode 38 are formed on the $n^+$-type layers 42, respectively. As a result, a self-aligned FET is prepared.

In the above embodiments, GaAs is used as the semiconductor substrate, W nitride and Ta nitride are used as the conductive layers, and Au is used as the metal layer. However, III-V semiconductor compounds such as GaP and InAs can also be used as a semiconductor substrate. Mo, Ti, Zr, Nb and Va nitrides can be used as the conductive layers. AuGe and Al can be used as the metal layers. In this case, substantially the same effect as in the above embodiments can be obtained.

According to the present invention, a semiconductor device having a good electrode surface after high-temperature annealing can be easily manufactured in accordance with the self-alignment technique.

While, the salient features of the invention have been described with reference to the drawings, it should be understood that the preferred embodiments described herein are susceptible of modifications and alternations without departing from the spirit and scope of the following claims.

What is claimed is:
1. A semiconductor device comprising:
a III-V compound semiconductor substrate;

a first conductive layer comprising a nitride of a high-melting transition metal of one of Groups IV, V and VI of the Periodic Table formed on said substrate;

a second conductive layer comprising a nitride of a high-melting transition metal of one of Groups IV, V and VI of the Peiodic Table formed on said first conductive layer, said nitride being different in composition from that of said nitride of the first conductive layer; and an electrode metal layer formed on said second conductive layer.

2. A device according to claim 1, wherein said first and second conductive layers and said electrode metal layer constitute a gate electrode of a field effect transistor.

3. A device according to claim 1, wherein the first conductive layer has a thickness greater than that of the second conductive layer.

4. A device according to claim 3, wherein the thickness of the first conductive layer falls within a range of 1,000 to 2,000 Å, and the thickness of the second conductive layer falls within a range of 500 to 1,000 Å.

5. A device according to claim 1, wherein the electrode metal layer comprises a gold film.

6. A device according to claim 5, wherein the gold film has a thickness of 2,000 to 8,000 Å.

7. A device according to claim 1, wherein the III-V compound comprises gallium arsenide.

8. A device according to claim 1, wherein the high-melting transition metal nitrides of said first and second conductive layers comprises at least one compound selected from the group consisting of tungsten nitride, tantalum nitride, molybdenum nitride, titanium nitride, niobium nitride, vanadium nitride, and zirconium nitride.

9. A device according to claim 8, wherein the high-melting transition metal nitrides of said first and second conductive layers comprises at least one compound selected from the group consisting of tungsten nitride and tantalum nitride.

* * * * *